US010736246B2

(12) United States Patent
Lee et al.

(10) Patent No.: US 10,736,246 B2
(45) Date of Patent: Aug. 4, 2020

(54) ELECTROMAGNETIC INTERFERENCE SHIELDING HAVING A MAGNETICALLY ATTRACTED SHIELD ARM

(71) Applicant: Intel Corporation, Santa Clara, CA (US)

(72) Inventors: Jaejin Lee, Beaverton, OR (US); Chung-Hao Chen, Portland, OR (US); Hao-Han Hsu, Portland, OR (US); Xiang Li, Portland, OR (US); Jun Liao, Hillsboro, OR (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 16/146,501

(22) Filed: Sep. 28, 2018

(65) Prior Publication Data

US 2020/0107476 A1 Apr. 2, 2020

(51) Int. Cl.
*H05K 9/00* (2006.01)
*H05K 3/28* (2006.01)

(52) U.S. Cl.
CPC ........... *H05K 9/0024* (2013.01); *H05K 3/284* (2013.01); *H05K 2201/0707* (2013.01); *H05K 2201/09618* (2013.01); *H05K 2201/09818* (2013.01); *H05K 2201/10371* (2013.01)

(58) Field of Classification Search
CPC .... H05K 9/0024; H05K 9/0032; H05K 3/284; H05K 2201/0707; H05K 2201/10371
See application file for complete search history.

(56) References Cited

U.S. PATENT DOCUMENTS

| | | | | | |
|---|---|---|---|---|---|
| 8,276,262 | B2 * | 10/2012 | Wienrich | H01L 21/683 | 118/500 |
| 2007/0205019 | A1 * | 9/2007 | Holmberg | H05K 9/0032 | 174/377 |
| 2008/0179086 | A1 * | 7/2008 | English | H05K 9/0032 | 174/384 |
| 2008/0310139 | A1 * | 12/2008 | English | H05K 9/0032 | 361/818 |
| 2010/0157566 | A1 * | 6/2010 | Bogursky | H01L 23/552 | 361/816 |
| 2012/0015127 | A1 * | 1/2012 | Kurz | H05K 9/0026 | 428/43 |
| 2013/0027893 | A1 * | 1/2013 | Vinokur | H05K 9/0032 | 361/748 |
| 2013/0235528 | A1 * | 9/2013 | Lee | H05K 7/20418 | 361/704 |
| 2015/0264842 | A1 * | 9/2015 | Song | H05K 9/0032 | 361/714 |
| 2016/0286647 | A1 * | 9/2016 | Hoang | H01L 21/481 | |
| 2016/0301442 | A1 * | 10/2016 | Sohn | H04B 1/3888 | |

(Continued)

*Primary Examiner* — Daniel P Wicklund
*Assistant Examiner* — Douglas R Burtner
(74) *Attorney, Agent, or Firm* — Eschweiler & Potashnik, LLC

(57) ABSTRACT

An electromagnetic interference (EMI) shielding can be couplable to a circuit board. The EMI shielding can include a fence couplable to the circuit board, a lid couplable to the fence, and a shield arm extending from the lid and being configured to couple to the fence. The shield arm can be hingedly or rotatably coupled to the lid. The shield arm can be magnetically couplable to the lid. The shield arm and/or the fence can include a magnet to provide a magnetic attraction between the shield arm and the fence.

24 Claims, 7 Drawing Sheets

(56) References Cited

U.S. PATENT DOCUMENTS

| | | | | |
|---|---|---|---|---|
| 2016/0363329 | A1* | 12/2016 | Kim | F24F 13/0218 |
| 2017/0110229 | A1* | 4/2017 | Venuti | H01F 7/0242 |
| 2017/0164498 | A1* | 6/2017 | Song | H05K 1/181 |
| 2017/0220074 | A1* | 8/2017 | Cooper | G06F 1/1658 |
| 2018/0042147 | A1* | 2/2018 | Mun | H05K 9/0024 |
| 2018/0049311 | A1* | 2/2018 | Hoang | H05K 1/181 |
| 2018/0110158 | A1* | 4/2018 | Talpallikar | F28F 13/003 |
| 2018/0132390 | A1* | 5/2018 | Jeong | H05K 1/095 |
| 2018/0228063 | A1* | 8/2018 | Dixon | H01L 23/552 |
| 2018/0359884 | A1* | 12/2018 | Yuasa | H01L 23/3675 |

* cited by examiner

ELECTROMAGNETIC INTERFERENCE SHIELDING HAVING A MAGNETICALLY ATTRACTED SHIELD ARM

BACKGROUND

Field

Aspects described herein generally relate to electromagnetic interference (EMI) shielding for a circuit board (e.g. a printed circuit board), including EMI shielding that includes one or more shield arms.

Related Art

Electronic products emit electromagnetic radiation. On-board EMI shields have been used in electronic devices to suppress unintentional noise radiations from active circuits and motherboards. The conventional on-board shields require continuous mechanical-compressive force along the peripheral of the shield to have good shielding effectiveness. Mechanical screws, EMI clips, and or other interfaces are used to securely place the shield. However, the conventional mechanical approaches require tight design tolerance and expensive tooling cost to ensure sufficient mounting force and good bonding contact between shield lid and fence, as well as result in noise leakage due to mechanical deformation. In addition, shielding effectiveness depends largely on mechanical joint lifetime and will be substantially degraded through a number of assemblies.

BRIEF DESCRIPTION OF THE DRAWINGS/FIGURES

The accompanying drawings, which are incorporated herein and form a part of the specification, illustrate the aspects of the present disclosure and, together with the description, further serve to explain the principles of the aspects and to enable a person skilled in the pertinent art to make and use the aspects.

The exemplary aspects of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

Figure 1A:
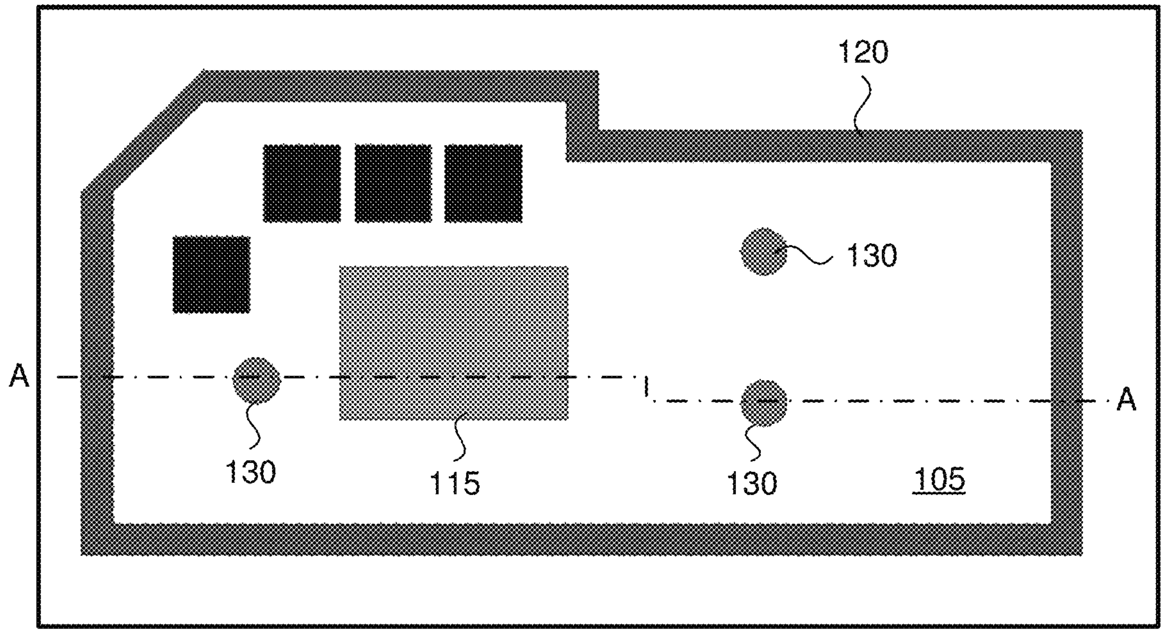
FIGS. 1A-1B illustrate an example circuit board having an electromagnetic interference (EMI) shield.
Figure 1B:
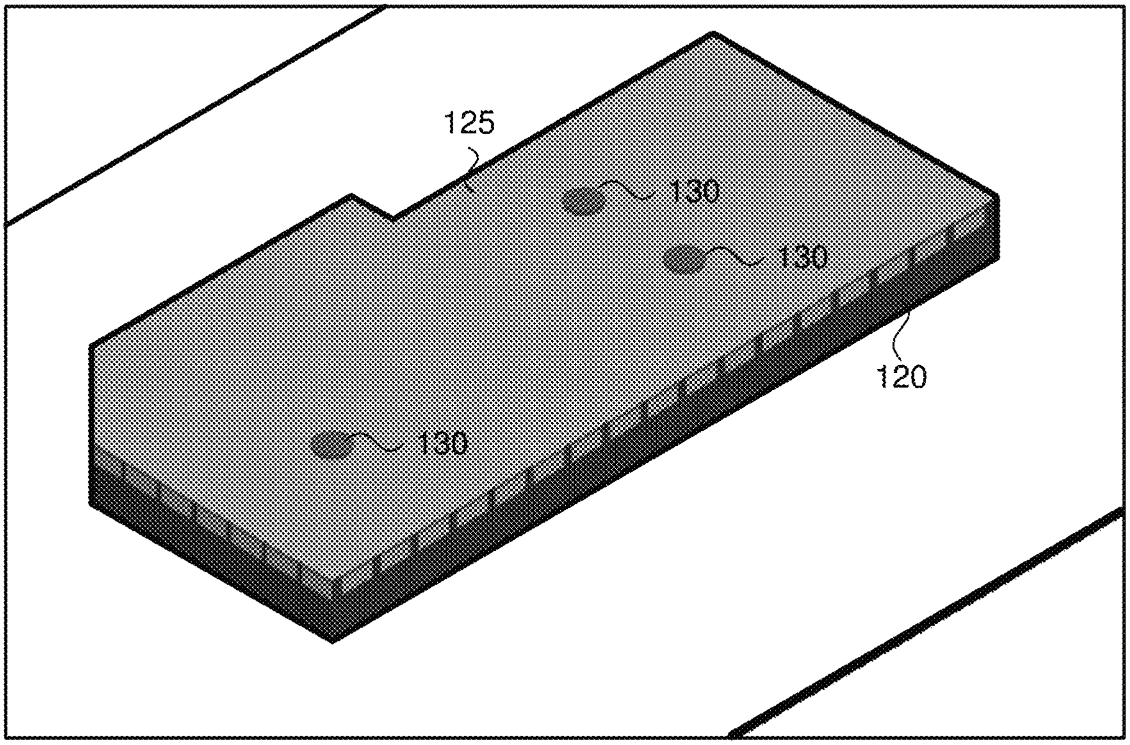

Aspects of the present disclosure relate to one or more systems, devices, apparatus, and/or assemblies configured to enhance EMI shielding. FIGS. 1A-1B illustrate an example circuit board 105 having an electromagnetic interference (EMI) shield that includes a fence 120 and a lid 125 coupled to the circuit board 105 and fence 120 by one or more screws 130. The lid 125 and fence enclose one or more components (e.g. chip 115) on the circuit board 105.

In one or more aspects of the present disclosure, the EMI shield system includes a one or more magnetized shielding bodies that provide continuous attractive force between two or more portions of the EMI shield (e.g. without any mechanical parts). Advantageously, the EMI shield improves shielding performance, relaxes design specifications, and reduces tooling cost. Further, magnetized shielding bodies maintain their magnetisms over time and may loses only a very small fraction of their magnetism over time (e.g. ~1% over 10 years). As a result, EMI shielding systems according to the aspects of the present disclosure will sustain increased shielding performance regardless of a number of assemblies and address big drawback of mechanical joint lifetime for conventional mechanical approaches. That is, advantageously, exemplary aspects include a magnetically-assisted shielding configuration that provides continuous attractive-magnetic force without any mechanical parts. Aspects improve shielding performance, relax design specifications, and reduce tooling cost.

Figure 7A:
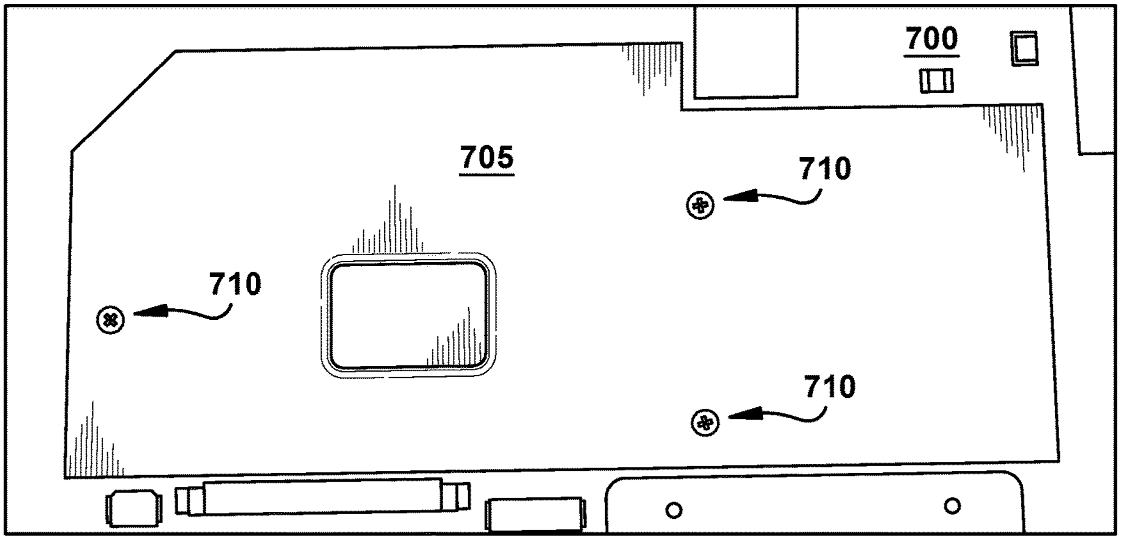
FIGS. 7A-7C illustrate an example circuit board having an electromagnetic interference (EMI) shield that exhibits mechanical deformation.
Figure 7B:
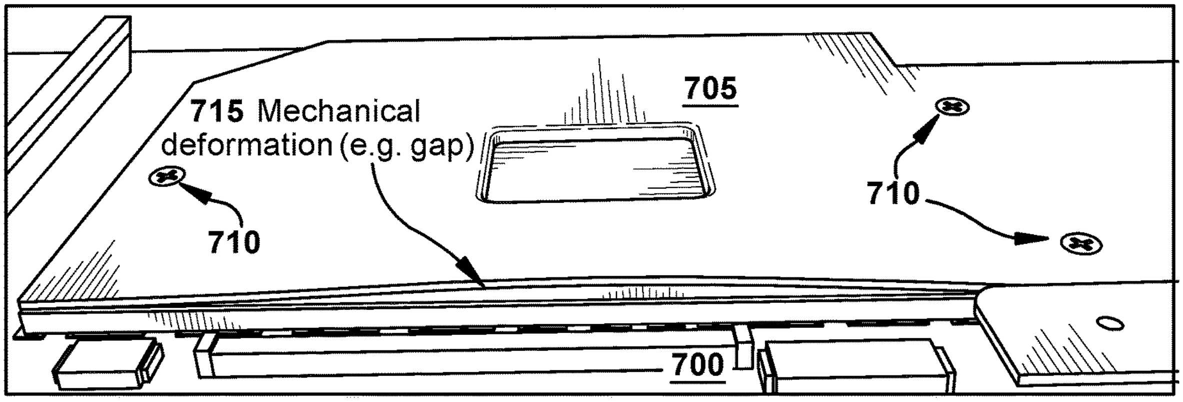
Figure 7C:
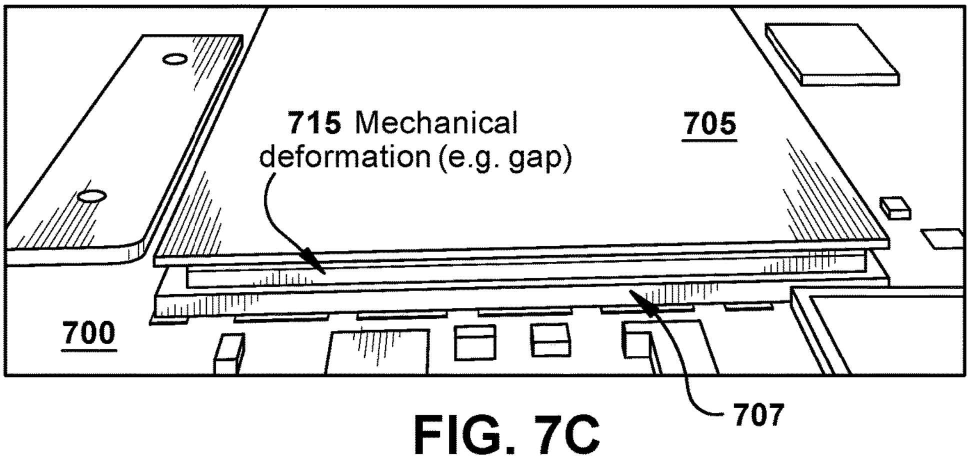

FIGS. 7A-7C show a conventional on-board shield system. FIG. 7A is a top plan view and FIGS. 7B-7C are side perspective views.

The shield system shown in FIGS. 7A-7C has a shielding lid 705 secured with mechanical screws 710, which cause mechanical deformation 715 of the lid 705 (e.g. at the periphery of the lid). The mechanical deformations 715 result in one or more openings or gaps forming between the lid 705 and the base of the shield or fences 707. This undesirable mechanical distortion/deformation and warpage of the lid 705 may be caused by poor tooling and/or design tolerances result in inconsistent compressive-force along the peripheral and poor mounting joints with large electrical openings (gaps) between the fence and lid. As a result of the openings/gaps, significant electrical and/or electromagnetic noise/interference can leak or otherwise exit from the interior of the shield system and deteriorate shielding effectiveness. This is further illustrated in FIG. 2, which is described in detail below.

Figure 2:
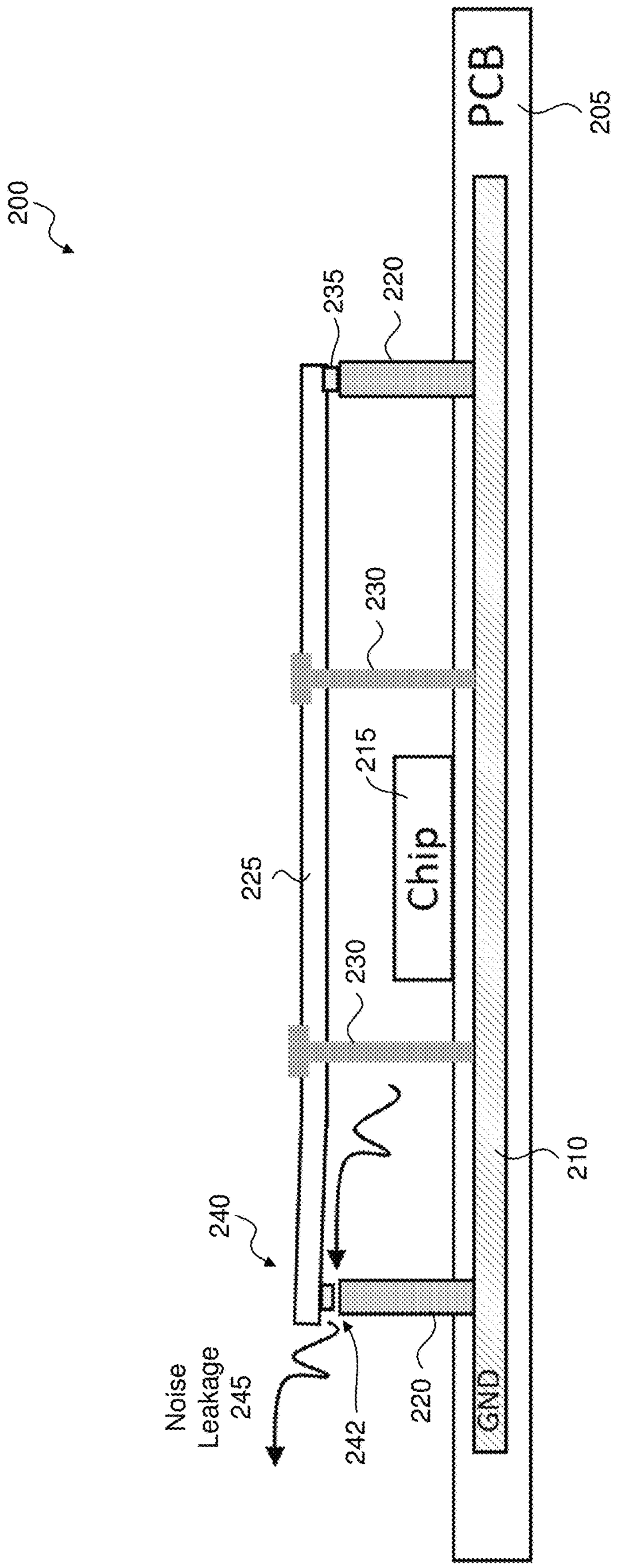
FIG. 2 illustrates a cross-sectional view of an example circuit board having an EMI shield that exhibits noise leakage due to mechanical deformation.

FIG. 2 illustrates a cross-sectional view of a circuit board 205 having an EMI shield system 200. The cross section is take along line A-A as shown in FIG. 1A.

The circuit board 205 can be a printed circuit board (PCB) and can include a ground plane 210. The circuit board 205 can support one or more chips 215, such as one or more integrated circuits (ICs), processors, analog and/or digital circuit components, or the like.

The EMI shield system 200 includes one or more fences 220 that define the lateral dimensions of the EMI shield system 200. The fences 220 are coupled to and extend from a surface of the circuit board 205. The EMI shield system 200 further includes a lid or planar top portion 225 that is couplable to the fences 220. The lid 225 is secured to the circuit board 205 and the fences 220 by one or more screws 225. When secured to the circuit board 205 and the fences 220, the lid 225 may exhibit mechanical deformation, distortion, and/or warpage 240 which causes an opening or gap 242 to form between the fence 220 and lid 225. The EMI shield system 200 may also include one or more EMI gaskets 235 between the fences 220 and lid 225. In this example, the opening or gap 242 is formed between the gasket 225 and the fence 220 (as shown), or between the gasket 235 and lid 225.

The mechanical deformation, distortion, and/or warpage 240 which causes an opening or gap 242 to form may result in electrical and/or electromagnetic noise/interference to leak, escape, or otherwise exit the interior of the EMI shield system 200. In this example, the interior refers to the area that is defined by the circuit board 205, fence(s) 220, and lid 225.

Figure 3A:
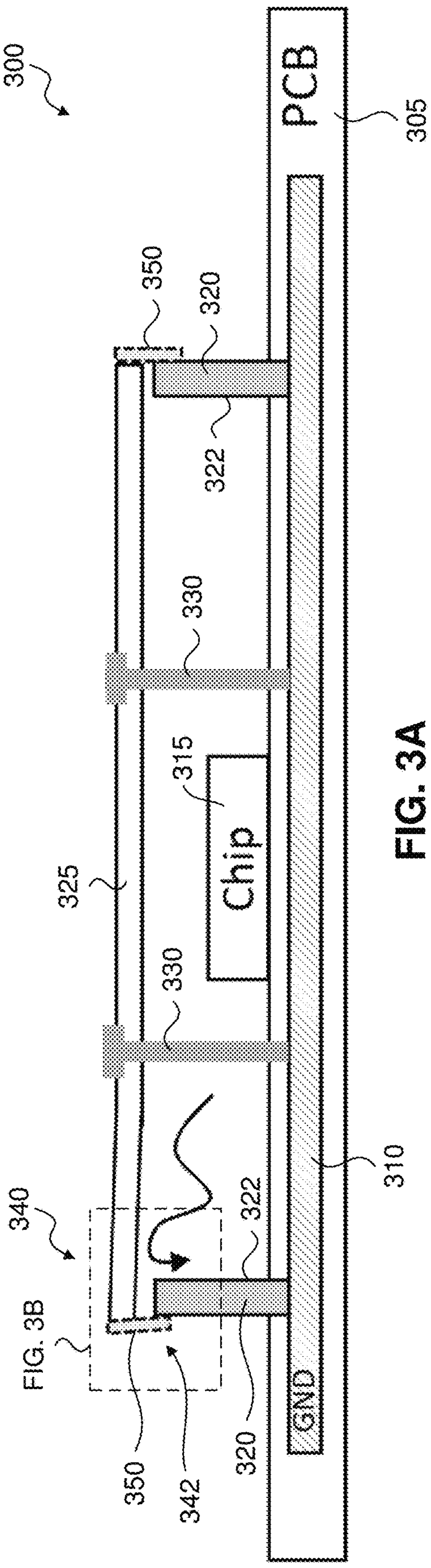
FIG. 3A illustrates a cross-sectional view of a circuit board having an EMI shield according to an exemplary aspect of the present disclosure.
Figure 3C:
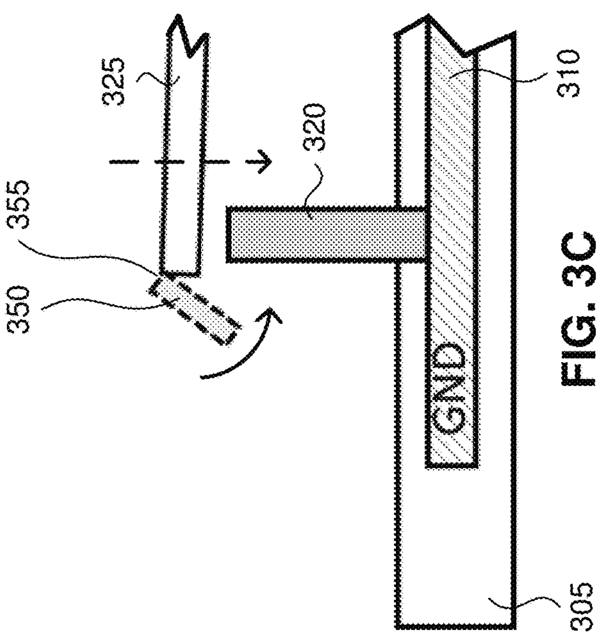
FIG. 3C illustrates a partial view of the EMI shield of FIG. 3A.
Figure 3B:
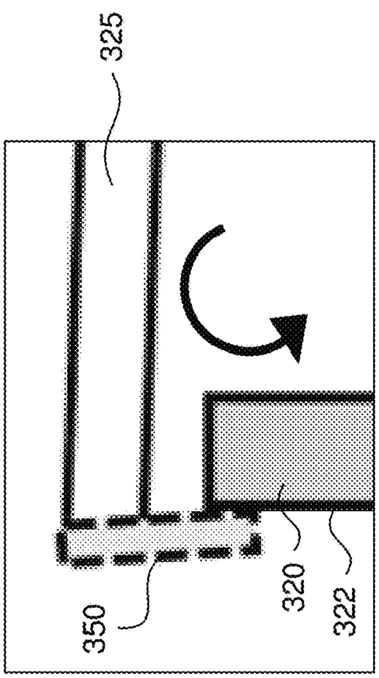
FIG. 3B is an enlarged view of a shielding arm as shown in FIG. 3A.

FIGS. 3A-3C a circuit board 305 having an EMI shield 300 according to an exemplary aspect of the present disclosure. FIG. 3A shows a cross-sectional view of a circuit board and EMI shield 300. The cross section is similar to the cross section taken along line A-A in FIG. 1A. FIG. 3B is an enlarged view of a portion the EMI shield 300 as shown in FIG. 3A. FIG. 3C illustrates a partial view of the EMI shield 300 of FIG. 3A.

The circuit board 305 can be a printed circuit board (PCB) and can include a ground plane 310. The circuit board 305 can support one or more chips 315, such as one or more integrated circuits (ICs), processors, analog and/or digital circuit components, or the like.

In an exemplary aspect, the EMI shield system 300 includes one or more fences or wall portions 320 that define the lateral dimensions of the EMI shield system 300. The fences 320 are coupled to and extend from a surface of the circuit board 305.

In an exemplary aspect, the EMI shield system 300 further includes a lid or planar top portion 325 that is couplable to the fences 320. The lid 325 is secured to the circuit board 305 and the fences 320 by one or more fasteners 325. The fasteners 325 can include, for example, screws, clips, bolts, connectors, or one or more other fasteners as would be understood by one of ordinary skill in the arts. In an exemplary aspect, the lid 325 is made of metal or a metal alloy.

In an exemplary aspect, the fence(s) 320 includes a magnet (e.g. a permanent magnet). In an exemplary aspect, the fence(s) 320 is electrically conductive. In this example, the fence(s) 320 can include a conductive coating or finish 322, such as a metallic surface or finish formed on outer surface of the fence 320. In an exemplary aspect, the fence 320 is formed by a permanent magnet having a conductive outer surface 322. In an exemplary aspect, the conductive outer surface 322 is metallic or formed of a metallic alloy. For example, the outer surface 322 can be formed by a noble metal, noble metal alloy, nickel, and/or one or more additional or alternative conductive materials as would be understood by one of ordinary skill in the art. In an exemplary aspect, the outer surface 322 is conductive and/or resistant to oxidation.

In an exemplary aspect, the EMI shield system 300 includes one or more shield arms 350 that are configured to couple the lid 325 to the fence 320. The shield arm 350 extends from the lid 325 to the fence 320 across the opening/gap 342. The shield arms 350 can also be referred to as lateral portions or segments, shield bodies, magnetized shield bodies, lips, skirts, peripheral skirts, peripheral walls or projections, edge shields, lateral covers, wings, peripheral wings, wing portions, wall or lid extensions, wall or lid extension members, a band (e.g. extending around the shield system), flanges, tabs, or the like.

Figure 5:
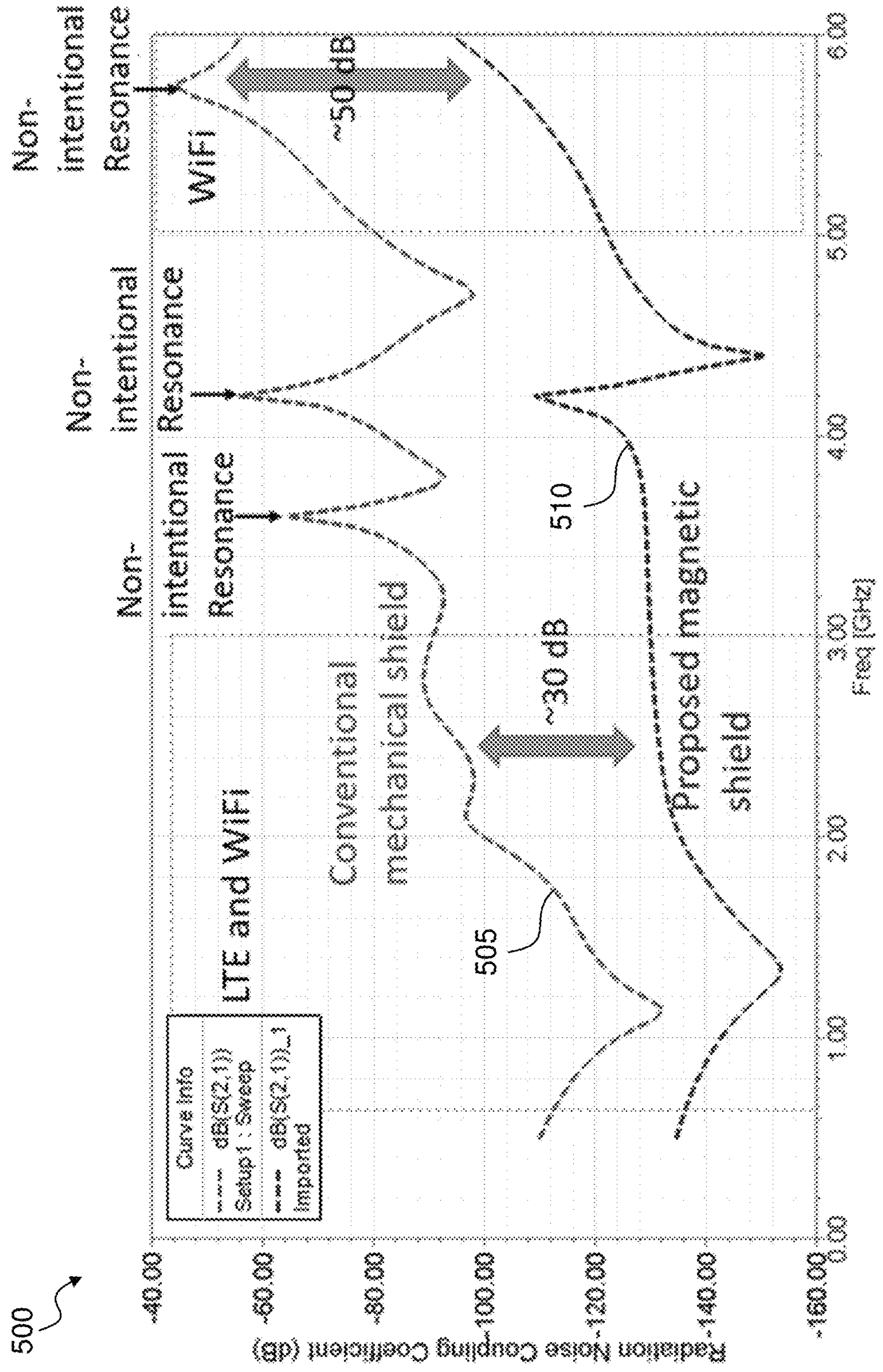
FIG. 5 illustrates a radiation noise coupling coefficient plot according to an exemplary aspect of the present disclosure.

When secured to the circuit board 305, the lid 325 may exhibit mechanical deformation, distortion, and/or warpage 340 which causes an opening or gap 342 to form between the fence 320 and lid 325. Advantageously, in one or more exemplary aspects, the shield arms 350 are configured to close, seal, or otherwise cover the open/gap 342 to prevent or reduce electrical and/or electromagnetic noise/interference/emissions leaking, escaping, or otherwise exiting (and/or entering) the interior of the EMI shield system 300. This is illustrated in FIGS. 3A and 3B which shows the noise/interference being blocked from escaping the interior. In this example, the noise is illustrated by curved arrow in FIG. 3A and a semi-circular arrow in FIG. 3B. In an exemplary aspect, the interior refers to the area that is defined by the circuit board 305, fence(s) 320, and lid 325 in which the chip 315 is housed. This reduction or prevention of leakage is illustrated in FIGS. 5 and 6B. In an exemplary aspect, one or more components of the EMI shield system 300 (e.g. fence 320, lid 325, and/or arms 350) prevent or reduce electrical and/or electromagnetic noise/interference/emissions leaking, escaping, or otherwise exiting (and/or entering) the interior of the EMI shield system 300. For example, one or more components of the EMI shield system 300 can be configured to reduce or prevent incoming and/or outgoing emissions of electromagnetic frequencies.

In an exemplary aspect, the shield arm(s) 350 are rotatably and/or hingedly coupled to the lid 325. In this example, as illustrated by the curved arrow in FIG. 3C, the shield arm 350 can rotate towards the fence 320 to close, seal, or otherwise cover the open/gap 342 formed between the lid 325 and the fence 320. In this example, the shield arm 350 can be connected to the lid 325 by a hinge 355. The hinge 355 may be a mechanical bearing, barrel hinge, living hinge, flexure bearing, flexible member or film, or other hinge means as would be understood by one of ordinary skill in the art. The hinge 355 couples the lid 325 and shield 350, and allows the shield arm 350 to rotate about the end of the lid 325.

In an exemplary aspect, the shield arm 350 is magnetically attracted to the fence 320. For example, the shield arm 350 is magnetically attracted to the permanent magnet included in the fence 320. In this example, the magnetic attraction causes the shield arm 350 to move (e.g. rotate) towards and couple to the fence 320.

As shown in FIG. 3C, the shield arm 350 is coupled to the end of the lid 325 and rotatable towards the fence 320. In this example, the shield arm 350 can be rotatably coupled or connected to the lid 325 (e.g. at an end of the lid 325). In an exemplary aspect, the rotation is caused by a magnetic attraction between the fence 320 and shield arm 350. In an exemplary aspect, the shield arm 350 includes a magnet (e.g. permanent magnet) in addition to the permanent magnet within the fence 320. In another aspect, the shied arm 350 includes a magnet and the magnet is omitted from the fence 320. In an exemplary aspect, the magnets included in the shield arm 350, fence 320, and/or lid 325 are a ferrite permanent magnet, but are not limited thereto. For example, the magnets can be neodymium magnets, Alnico magnets, rare-earth magnets, or another magnet type as would be understood by one of ordinary skill in the art.

In an exemplary aspect, the shield arm 350 is separable from the fence 325 and the fence 320, and is magnetically attracted to the fence 320 (and/or the lid 325). For example, the shield arm 350 can include a magnet that results in a magnetic attraction between the shield arm 350 and the fence 320 and/or lid 325. In another aspect, the shield arm 350 does not include a magnet is magnetically attracted to a magnet within the fence 320 and/or lid 325. In an exemplary aspect, the lid 325 is also magnetically attracted to the fence 320 as shown by the downward dashed arrow in FIG. 3C.

In an exemplary aspect, the shield arm 350 and/or lid 325 is a soft magnetic material (e.g. soft magnetic steel). In this example, the fence 320 can include a magnet that magnetically attracts the shield arm 350 and/or lid 325 to the fence 320. In another aspect, the fence 320 is made of a soft magnetic material while the shield arm 350 includes a magnet. In another aspect, both the shield arm 350 and the fence 320 includes a magnet. A portion or all of the lid 325 may also include a magnet to increase the magnetic attraction between the fence 320, lid 325, and shield arm 350.

In an exemplary aspect, the shield arm 350 is disposed within the perimeter formed by the fence 320 so as to be formed within the interior of the fences 320. In this example, the shield arm 350 can extend down from the bottom surface of the lid 325 and move outward towards the interior-side of the fence 320. In another aspect, the shield arm 350 is coupled (e.g. magnetically coupled) to the interior-side of the fence 320 and extend upward towards the bottom side of the lid 325 to close off the opening/gap 342.

In an exemplary aspect, the fence 320 (e.g. outer surface 322), lid 325, and/or shield arm 350 are formed of a conductive material and/or of a material that is resistant to oxidation. In this examples, lid 325 and/or shield arm 350 can include an outer conductive surface or coating similar to surface 322.

Figure 4A:
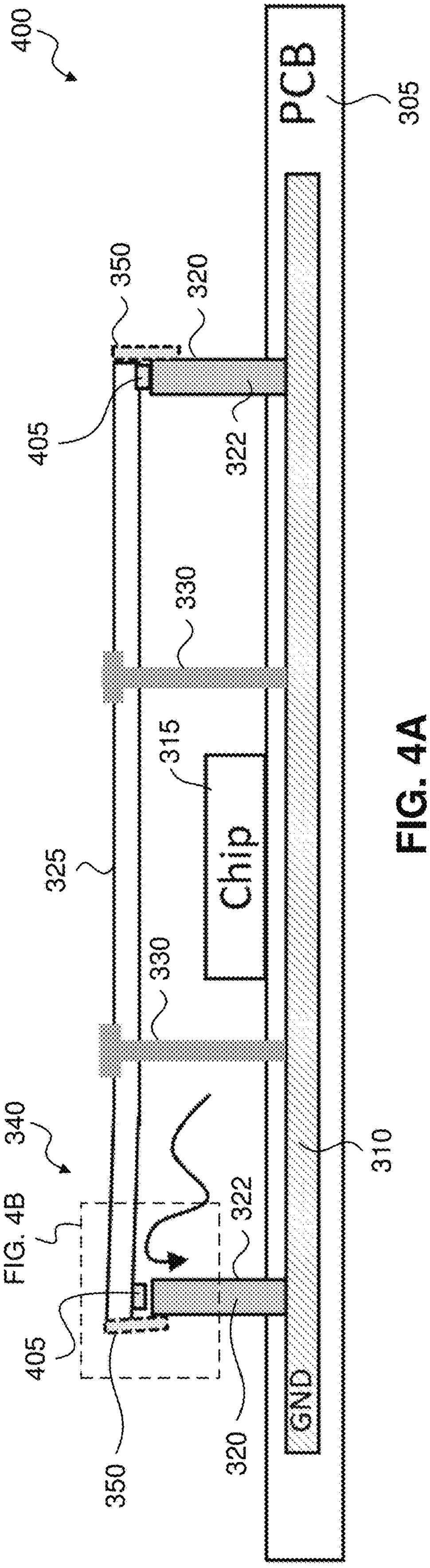
FIG. 4A illustrates a cross-sectional view of a circuit board having an EMI shield according to an exemplary aspect of the present disclosure.
Figure 4B:
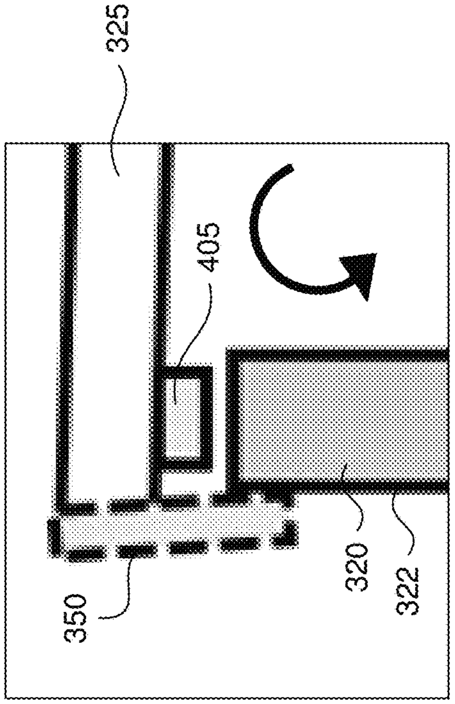
FIG. 4B is an enlarged view of a shielding arm as shown in FIG. 4A.

In an exemplary aspect, with reference to FIGS. 4A-4B, the EMI shield system 300 may also include one or more EMI gaskets 405 between the fences 320 and lid 325. In aspects that include EMI gasket(s) 405, the EMI shield system is referred to as EMI system 400 as shown in FIGS. 4A-4B. In this example, the opening or gap 342 is formed between the gasket 405 and the fence 320 (as shown), or between the gasket 405 and lid 325 if the gasket 405 coupled to the fence 320.

Advantageously, because EMI shield system 300 and EMI shield system 400 include one or more shield arms 350, the systems provide increased EMI shielding reliability and effectiveness by reducing or preventing openings/gaps within the EMI shielding. In particular, the systems of the present disclosure provide improved EMI shielding even in cases where mechanical warpage/deformation may result (e.g. along the peripheral of the on-board shield).

Further, the magnetized bodies (e.g. magnetized fence 320 and/or shield arms 350) advantageously generate continuous attractive force between one another without requiring mechanical parts. This improves bonding joints and contacts, leading to improvements in the EMI shielding effectiveness and performance, while reducing tooling cost, relaxing design specifications, and reducing effects of mechanical joint lifetimes.

FIG. 5 illustrates a radiation noise coupling coefficient plot 500 according to an exemplary aspect of the present disclosure.

The plot 500 includes the radiation noise coupling coefficient (dB) with respect to Frequency (GHz) for conventional shielding 505 and EMI shielding systems 510 according to exemplary aspects of the present disclosure. The radiation noise coupling coefficient for the exemplary EMI shielding systems shown as line 510 is reduced by 30 or more decibels (e.g. 30-50 dB) compared to conventional shielding designs.

Figure 6A:
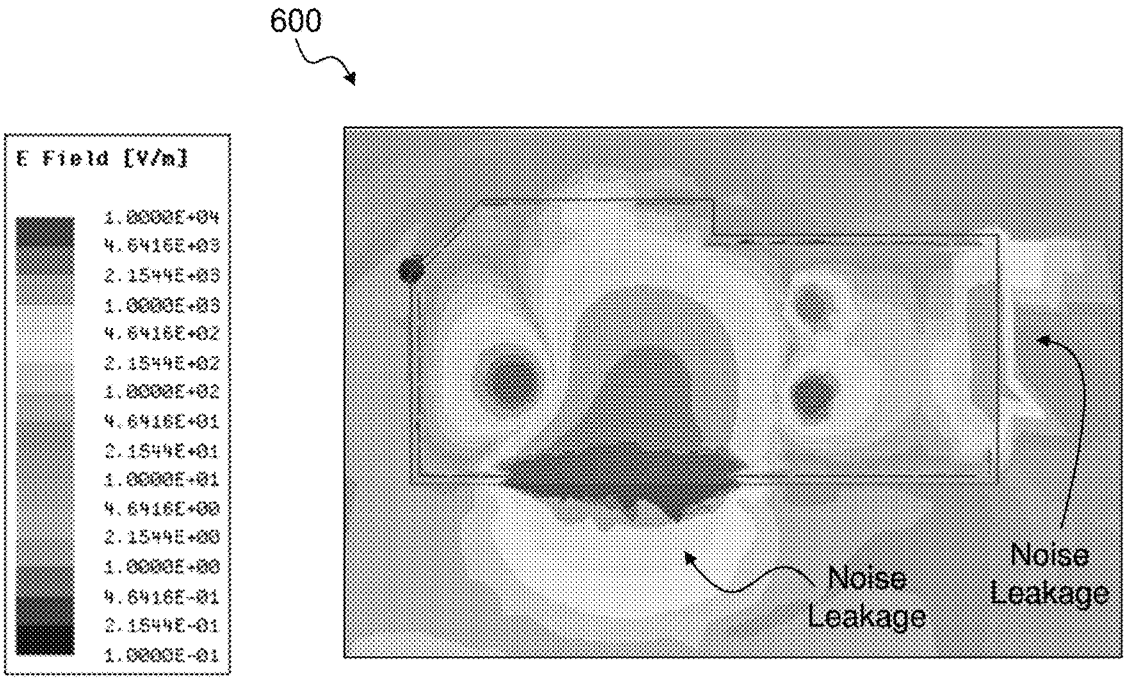
FIG. 6A illustrates an electric field distribution analysis of a circuit board having conventional EMI shielding.
Figure 6B:
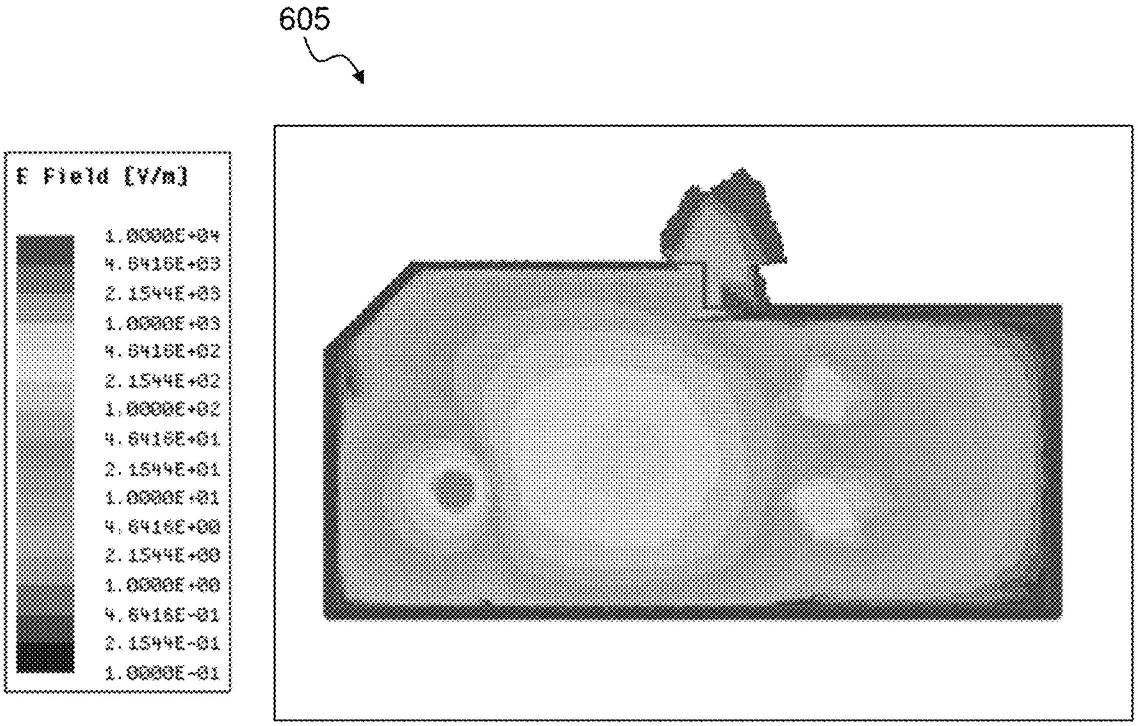
FIG. 6B illustrates an electric field distribution analysis of a circuit board having an EMI shield according to exemplary aspects of the present disclosure.

FIG. 6A illustrates an electric field distribution analysis of a circuit board having conventional EMI shielding. FIG. 6B illustrates an electric field distribution analysis of a circuit board having an EMI shield according to exemplary aspects of the present disclosure. As shown in FIG. 6A, conventional designs generates unintentional resonances due to electrical openings/gaps resulting from poor/inconsistent mechanical-compressive force. This can result in increased radio-frequency and/or electromagnetic interference.

Advantageously, EMI shielding systems according to exemplary aspects of the present disclosure provide improved noise shielding as shown in FIG. 6B.

EXAMPLES

Example 1 is an electromagnetic interference (EMI) shielding couplable to a circuit board, comprising: a fence couplable to the circuit board; a lid couplable to the circuit board and positioned adjacent to the fence; and a shield arm extending from the lid and being configured to couple to the fence.

Example 2 includes the subject matter of Example 1, wherein the shield arm is hingedly or rotatably coupled to the lid.

Example 3 includes the subject matter of Example 1, wherein the shield arm is magnetically couplable to the fence and/or lid.

Example 4 includes the subject matter of any of Examples 1-3, wherein the shield arm is configured to close off an opening or gap between the lid and the fence.

Example 5 includes the subject matter of any of Examples 1-4, wherein the shield arm is configured to move towards the fence, to close off the opening or gap, due to a magnetic attraction between the shield arm and the fence.

Example 6 includes the subject matter of any of Examples 1-5, wherein the shield arm is configured to be brought into contact with the fence to close off the opening or gap due to a magnetic attraction between the shield arm and the fence.

Example 7 includes the subject matter of any of Examples 1-6, wherein the fence comprises a permanent magnet and the shield arm is magnetically attracted to the permanent magnet of the fence.

Example 8 includes the subject matter of Example 7, wherein the lid is magnetically attracted to the permanent magnet of the fence.

Example 9 includes the subject matter of any of Examples 7-8, wherein the fence further comprises an outer conductive surface formed on the permanent magnet.

Example 10 includes the subject matter of Example 9, wherein the outer conductive surface is formed by a metallic surface.

Example 11 includes the subject matter of Examples 10, wherein the metallic surface is a noble metal, a noble metal alloy, or nickel.

Example 12 includes the subject matter of any of Examples 1-11, wherein the shield arm comprises a permanent magnet and the shield arm is magnetically attracted to the fence.

Example 13 includes the subject matter of any of Examples 12, wherein the fence comprises a permanent magnet and the permanent magnet of the shield arm is magnetically attracted to the permanent magnet of the fence.

Example 14 includes the subject matter of any of Examples 1-13, wherein the shield arm, the lid, and/or the fence are configured to block, shield, or reduce EMI.

Example 15 is an electronic device comprising the EMI shielding of any of Examples 1-14.

Example 16 is an electromagnetic interference (EMI) shielding system, comprising: a wall portion; a planar portion adjacent to the wall portion; and a lateral portion extending from the planar portion and being configured to couple to the wall portion.

Example 17 includes the subject matter of Example 16, wherein the wall portion is perpendicular to the planar portion.

Example 18 includes the subject matter of any of Examples 16-17, wherein the lateral portion is magnetically couplable to the planar portion.

Example 19 includes the subject matter of any of Examples 16-18, wherein the lateral portion is configured to move towards the wall portion based on a magnetic attraction between the lateral portion and the wall portion to close off an opening between the wall portion and planar portion.

Example 20 includes the subject matter of any of Examples 16-19, wherein the wall portion comprises a permanent magnet and the lateral portion is magnetically attracted to the permanent magnet of the wall portion.

Example 21 includes the subject matter of any of Examples 16-20, wherein the lateral portion comprises a permanent magnet and the permanent magnet of the lateral portion is magnetically attracted to the wall portion.

Example 22 includes the subject matter of any of Examples 16-21, wherein the EMI shielding system couplable to a circuit board.

Example 23 includes the subject matter of any of Examples 16-22, wherein the wall portion is couplable to a circuit board, the planar portion being couplable to the wall portion and the circuit board.

Example 24 includes the subject matter of any of Examples 16-23, wherein the wall portion, planar portion, and/or lateral portion are configured to block, shield, or reduce EMI.

Example 25 is an electromagnetic interference (EMI) shielding couplable to a circuit board, comprising: first shielding means couplable to the circuit board; second shielding means couplable to the circuit board and positioned adjacent to the first shielding means; and third shielding means extending from the second shielding means and being configured to couple to the first shielding means.

Example 26 includes the subject matter of Example 25, wherein the third shielding means is hingedly or rotatably coupled to the second shielding means.

Example 27 includes the subject matter of Example 25, wherein the third shielding means is magnetically couplable to the first shielding means and/or second shielding means.

Example 28 includes the subject matter of any of Examples 25-27, wherein the third shielding means is configured to close off an opening or gap between the second shielding means and the first shielding means.

Example 29 includes the subject matter of any of Examples 25-28, wherein the third shielding means is configured to move towards the first shielding means, to close off the opening or gap, due to a magnetic attraction between the third shielding means and the first shielding means.

Example 30 includes the subject matter of any of Examples 25-29, wherein the third shielding means is configured to be brought into contact with the first shielding means to close off the opening or gap due to a magnetic attraction between the third shielding means and the first shielding means.

Example 31 includes the subject matter of any of Examples 25-30, wherein the first shielding means comprises a permanent magnet and the third shielding means is magnetically attracted to the permanent magnet of the first shielding means.

Example 32 includes the subject matter of Example 31, wherein the second shielding means is magnetically attracted to the permanent magnet of the first shielding means.

Example 33 includes the subject matter of any of Examples 31-32, wherein the first shielding means further comprises an outer conductive surface formed on the permanent magnet.

Example 34 includes the subject matter of Example 33, wherein the outer conductive surface is formed by a metallic surface.

Example 35 includes the subject matter of Examples 34, wherein the metallic surface is a noble metal, a noble metal alloy, or nickel.

Example 36 includes the subject matter of any of Examples 25-35, wherein the third shielding means comprises a permanent magnet and the third shielding means is magnetically attracted to the first shielding means.

Example 37 includes the subject matter of any of Examples 36, wherein the first shielding means comprises a permanent magnet and the permanent magnet of the third shielding means is magnetically attracted to the permanent magnet of the first shielding means.

Example 38 includes the subject matter of any of Examples 25-37, wherein the third shielding means, the second shielding means, and/or the first shielding means are configured to block, shield, or reduce EMI.

Example 39 is an electronic device comprising the EMI shielding of any of Examples 25-38.

Example 40 is an electromagnetic interference (EMI) shielding system, comprising: first shielding means; second shielding means adjacent to the first shielding means; and third shielding means extending from the second shielding means and being configured to couple to the first shielding means.

Example 41 includes the subject matter of Example 40, wherein the first shielding means is perpendicular to the second shielding means.

Example 42 includes the subject matter of any of Examples 40-41, wherein the third shielding means is magnetically couplable to the second shielding means.

Example 43 includes the subject matter of any of Examples 40-42, wherein the third shielding means is configured to move towards the first shielding means based on a magnetic attraction between the third shielding means and the first shielding means to close off an opening between the first shielding means and second shielding means.

Example 44 includes the subject matter of any of Examples 40-43, wherein the first shielding means comprises a permanent magnet and the third shielding means is magnetically attracted to the permanent magnet of the first shielding means.

Example 45 includes the subject matter of any of Examples 40-44, wherein the third shielding means comprises a permanent magnet and the permanent magnet of the third shielding means is magnetically attracted to the first shielding means.

Example 46 includes the subject matter of any of Examples 40-45, wherein the EMI shielding system couplable to a circuit board.

Example 47 includes the subject matter of any of Examples 40-46, wherein the first shielding means is couplable to a circuit board, the second shielding means being couplable to the first shielding means and the circuit board.

Example 48 includes the subject matter of any of Examples 40-47, wherein the first shielding means, second shielding means, and/or third shielding means are configured to block, shield, or reduce EMI.

Example 49 is an apparatus comprising the electromagnetic interference (EMI) shielding of any of Examples 1-48.

Example 50 is an electronic device comprising the electromagnetic interference (EMI) shielding of any of Examples 1-48.

Example 51 is a wireless communication device comprising the electromagnetic interference (EMI) shielding of any of Examples 1-48.

Example 52 is an apparatus as shown and described.

Example 53 is an electromagnetic interference (EMI) shield as shown and described.

CONCLUSION

The aforementioned description of the specific aspects will so fully reveal the general nature of the disclosure that others can, by applying knowledge within the skill of the art, readily modify and/or adapt for various applications such specific aspects, without undue experimentation, and without departing from the general concept of the present disclosure. Therefore, such adaptations and modifications are intended to be within the meaning and range of equivalents of the disclosed aspects, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one aspect," "an aspect," "an exemplary aspect," etc., indicate that the aspect described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

The exemplary aspects described herein are provided for illustrative purposes, and are not limiting. Other exemplary aspects are possible, and modifications may be made to the exemplary aspects. Therefore, the specification is not meant to limit the disclosure. Rather, the scope of the disclosure is defined only in accordance with the following claims and their equivalents.

What is claimed is:

1. Electromagnetic interference (EMI) shielding couplable to a circuit board, comprising:
- a fence couplable to the circuit board;
- a lid couplable to the circuit board and positioned adjacent to the fence; and
- a shield arm extending from the lid, wherein the shield arm is configured to move towards the fence, based on a magnetic attraction between the shield arm and the fence, to couple the shield arm to the fence to close off an opening or gap between the lid and the fence.

2. The EMI shielding of claim 1, wherein the shield arm is hingedly or rotatably coupled to the lid.

3. The EMI shielding of claim 1, wherein the shield arm is magnetically couplable to the fence and/or lid.

4. The EMI shielding of claim 1, wherein the shield arm is configured to be brought into contact with the fence, to close off the opening or gap, based on the magnetic attraction between the shield arm and the fence.

5. The EMI shielding of claim 1, wherein the fence comprises a permanent magnet and the shield arm is magnetically attracted to the permanent magnet of the fence.

6. The EMI shielding of claim 5, wherein the lid is magnetically attracted to the permanent magnet of the fence.

7. The EMI shielding of claim 5, wherein the fence further comprises an outer conductive surface formed on the permanent magnet.

8. The EMI shielding of claim 7, wherein the outer conductive surface is formed by a metallic surface.

9. The EMI shielding of claim 8, wherein the metallic surface is a noble metal, a noble metal alloy, or nickel.

10. The EMI shielding of claim 1, wherein the shield arm comprises a permanent magnet and the shield arm is magnetically attracted to the fence.

11. The EMI shielding of claim 10, wherein the fence comprises a permanent magnet and the permanent magnet of the shield arm is magnetically attracted to the permanent magnet of the fence.

12. The EMI shielding of claim 1, wherein the shield arm, the lid, and the fence are configured to block, shield, or reduce EMI.

13. An electronic device comprising the EMI shielding of claim 1.

14. Electromagnetic interference (EMI) shielding system, comprising:
- a wall portion;
- a planar portion adjacent to the wall portion; and
- a lateral portion extending from the planar portion and being configured to move towards the wall portion, based on a magnetic attraction between the lateral portion and the wall portion, to couple the lateral portion to the wall portion to close off an opening between the wall portion and the planar portion.

15. The EMI shielding system of claim 14, wherein the wall portion is perpendicular to the planar portion.

16. The EMI shielding system of claim 14, wherein the lateral portion is magnetically couplable to the planar portion.

17. The EMI shielding system of claim 14, wherein the wall portion comprises a permanent magnet and the lateral portion is magnetically attracted to the permanent magnet of the wall portion.

18. The EMI shielding system of claim 14, wherein the lateral portion comprises a permanent magnet and the permanent magnet of the lateral portion is magnetically attracted to the wall portion.

19. The EMI shielding system of claim 14, wherein the EMI shielding system couplable to a circuit board.

20. The EMI shielding system of claim 14, wherein the wall portion is couplable to a circuit board, the planar portion being couplable to the wall portion and the circuit board.

21. Electromagnetic interference (EMI) shielding couplable to a circuit board, comprising:

a fence including a permanent magnet, and being couplable to the circuit board;

a lid couplable to the circuit board and positioned adjacent to the fence; and a shield arm extending from the lid and being configured to be magnetically attracted to the permanent magnet of the fence to couple the shield arm to the fence.

22. Electromagnetic interference (EMI) shielding couplable to a circuit board, comprising:

a fence couplable to the circuit board;

a lid couplable to the circuit board and positioned adjacent to the fence; and a shield arm extending from the lid and including a permanent magnet, wherein the shield arm is configured to be magnetically attracted to the fence to couple the shield arm to the fence.

23. The EMI shielding of claim 22, wherein the fence comprises a permanent magnet and the permanent magnet of the shield arm is magnetically attracted to the permanent magnet of the fence.

24. Electromagnetic interference (EMI) shielding couplable to a circuit board, comprising:

a fence couplable to the circuit board;

a lid couplable to the circuit board and positioned adjacent to the fence; and a shield arm extending from the lid, wherein the shield arm is configured to move towards the fence, based on a magnetic attraction between the shield arm and the fence, to couple the shield arm to the fence.

* * * * *